(12) United States Patent
Wang et al.

(10) Patent No.: US 12,154,972 B2
(45) Date of Patent: Nov. 26, 2024

(54) DIFFUSED FIELD-EFFECT TRANSISTOR

(71) Applicant: Nexchip Semiconductor Corporation, Anhui (CN)

(72) Inventors: Menghui Wang, Anhui (CN); Ching-Ming Lee, Anhui (CN); Jinzhuan Zhu, Anhui (CN)

(73) Assignee: NEXCHIP SEMICONDUCTOR CORPORATION, Anhui (CN)

( * ) Notice: Subject to any disclaimer, the term of this patent is extended or adjusted under 35 U.S.C. 154(b) by 358 days.

(21) Appl. No.: 17/214,280

(22) Filed: Mar. 26, 2021

(65) Prior Publication Data

US 2021/0217878 A1 Jul. 15, 2021

Related U.S. Application Data

(62) Division of application No. 16/829,351, filed on Mar. 25, 2020, now Pat. No. 11,024,722.

(30) Foreign Application Priority Data

Jan. 15, 2020 (CN) .......................... 202010043997.4

(51) Int. Cl.
*H01L 29/66* (2006.01)
*H01L 29/06* (2006.01)
(Continued)

(52) U.S. Cl.
CPC .... *H01L 29/66681* (2013.01); *H01L 29/0653* (2013.01); *H01L 29/0873* (2013.01);
(Continued)

(58) Field of Classification Search
CPC ......... H01L 29/7816; H01L 29/66681–66689; H01L 29/0653; H01L 29/42368;
(Continued)

(56) References Cited

U.S. PATENT DOCUMENTS 5,382,536 A * 1/1995 Malhi ............... H01L 29/66659
257/E29.256
6,392,274 B1 * 5/2002 Tung .................. H01L 29/1083
257/E29.054
(Continued)

FOREIGN PATENT DOCUMENTS

| CN | 103258842 A | 8/2013 |
| CN | 104112769 A | 10/2014 |

(Continued)

*Primary Examiner* — Victor A Mandala
(74) *Attorney, Agent, or Firm* — MUNCY, GEISSLER, OLDS & LOWE, P.C.

(57) ABSTRACT

A diffused field-effect transistor (FET) is disclosed. The diffused FET is dually optimized in voltage resistance by incorporating both a trench isolation structure and a thick second oxide layer and thus has a more significantly improved breakdown voltage. With the thick second oxide layer ensuring suitable voltage resistance of the transistor device, its on-resistance can be reduced either by reducing the size of the trench isolation structure or increasing an ion dopant concentration of a drift region. As such, a good tradeoff between voltage resistance and on-resistance is achievable.

10 Claims, 6 Drawing Sheets

(51) Int. Cl.
  *H01L 29/08*   (2006.01)
  *H01L 29/423*  (2006.01)
  *H01L 29/78*   (2006.01)

(52) U.S. Cl.
  CPC .... *H01L 29/42368* (2013.01); *H01L 29/7816* (2013.01); *H01L 29/7835* (2013.01)

(58) Field of Classification Search
  CPC ......... H01L 21/76224; H01L 21/76232; H01L 21/76235; H01L 21/76221; H01L 21/76202; H01L 21/76205; H01L 21/7621; H01L 29/0873; H01L 29/7835; H01L 29/66659; H01L 29/78; H01L 29/0607; H01L 29/0649; H01L 29/402; H01L 29/66477
  See application file for complete search history.

(56) References Cited

U.S. PATENT DOCUMENTS

| | | | | |
|---|---|---|---|---|
| 7,973,333 | B2* | 7/2011 | Dietz | H01L 29/42368 |
| | | | | 257/E21.414 |
| 9,281,395 | B2* | 3/2016 | Lim | H01L 29/66681 |
| 2003/0153154 | A1* | 8/2003 | Uehara | H01L 29/7835 |
| | | | | 257/E29.054 |
| 2007/0235779 | A1* | 10/2007 | Dietz | H01L 29/42368 |
| | | | | 257/E29.268 |
| 2010/0102388 | A1* | 4/2010 | Levin | H01L 21/823814 |
| | | | | 257/E29.256 |
| 2010/0270616 | A1* | 10/2010 | Yanagi | H01L 29/8605 |
| | | | | 438/689 |
| 2012/0199904 | A1* | 8/2012 | Sasaki | H01L 29/7816 |
| | | | | 257/E29.256 |
| 2014/0231911 | A1* | 8/2014 | Kim | H01L 29/4933 |
| | | | | 438/286 |
| 2015/0187931 | A1* | 7/2015 | Yoo | H01L 29/66681 |
| | | | | 438/286 |
| 2017/0243971 | A1 | 8/2017 | Komatsu et al. | |
| 2017/0345925 | A1* | 11/2017 | Syo | H01L 21/02216 |
| 2018/0219533 | A1* | 8/2018 | Khayat | H03K 19/018507 |
| 2019/0348533 | A1* | 11/2019 | Huang | H01L 21/76202 |
| 2019/0378908 | A1* | 12/2019 | Park | H01L 21/32155 |
| 2020/0126990 | A1* | 4/2020 | Zhang | H01L 29/404 |
| 2021/0036150 | A1* | 2/2021 | He | H01L 29/7816 |
| 2021/0175347 | A1* | 6/2021 | He | H01L 29/7825 |

FOREIGN PATENT DOCUMENTS

| | | |
|---|---|---|
| CN | 105489481 A | 4/2016 |
| CN | 208385412 U | 1/2019 |
| CN | 110504318 A | 11/2019 |

* cited by examiner

DIFFUSED FIELD-EFFECT TRANSISTOR

CROSS-REFERENCE TO RELATED APPLICATION

This application is a divisional of U.S. patent application Ser. No. 16/829,351, filed Mar. 25, 2020, which claims the priority of Chinese patent application number 202010043997.4, filed on Jan. 15, 2020, the entire contents of which are incorporated herein by reference.

TECHNICAL FIELD

The present invention relates to the field of semiconductor technology and, in particular, to a diffused field-effect transistor (FET) and a method of fabricating the diffused FET.

BACKGROUND

Driven by the combined demand for portability and operating efficiency of electronics, highly integrated high-power devices continue developing. Power transistor devices have been widely used in the fields of switching power supplies, digital televisions, automotive electronics and industrial control. Among them, high-density BCD (Bipolar-CMOS-DMOS) devices are considered the most promising power integrated devices because their signal processing and power driving capabilities can meet the requirements of portability and low power consumption.

At present, among the key BCD components, the most urgent challenge to be addressed for diffused field-effect transistors (FETs) is how to improve the withstand voltage performance while not compromising their low on-resistance performance.

SUMMARY OF THE INVENTION

It is an objective of the present invention to overcome the above-described problem of the conventional diffused FETs by proposing a novel diffused FET with improved voltage resistance and uncompromised low on-resistance performance.

The proposing diffused FET includes:
a substrate, in which a drift region is formed, the drift region containing a drain region, wherein a source region is formed in the substrate and is located on one side of the drift region;
a trench isolation structure, formed in the drift region and located between the drain region and the source region;
a first oxide layer, formed on the substrate and extending from the source region to the drift region;
a second oxide layer, formed on the drift region and located on a side of the trench isolation structure closer to the source region, the second oxide layer having a thickness greater than a thickness of the first oxide layer; and
an electrode conductive layer, formed at least on the first and second oxide layers.

Optionally, the second oxide layer may be located between the first oxide layer and the trench isolation structure and connect the first oxide layer to the trench isolation structure.

Optionally, an end portion of the second oxide layer connecting the first oxide layer may have a gradually decreased thickness toward the first oxide layer.

Optionally, the second oxide layer may be partially embedded in the substrate, wherein the trench isolation structure has a top surface protruding beyond a top surface of the substrate.

Optionally, the trench isolation structure may have a top surface that is not lower than a top surface of the second oxide layer.

Optionally, the second oxide layer may have an average thickness greater than or equal to twice an average thickness of the first oxide layer.

Optionally, a well region may be further formed in the substrate on the one side of the drift region, wherein the source region is formed in the well region.

The present invention also provides a method of fabricating a diffused FET. The method includes:
providing a substrate and forming a mask layer on the substrate, the mask layer having at least one first window formed therein;
forming in the substrate an isolation trench in positional correspondence with the first window by etching the substrate with the mask layer serving as a mask, and forming a trench isolation structure by filling the isolation trench with an insulating material layer;
widening the first window in the mask layer into a second window, the second window exposing at least a portion of the substrate on one side of the trench isolation structure;
performing an oxidation process and thereby forming a second oxide layer on the portion of the substrate exposed in the second window;
removing the mask layer, forming a drift region in the substrate, and sequentially forming a first oxide layer and an electrode conductive layer over the substrate, wherein the drift region surrounds the trench isolation structure and extends beyond an outer edge of the second oxide layer, the first oxide layer located on a side of the second oxide layer farther away from the trench isolation structure, the second oxide layer having a thickness greater than a thickness of the first oxide layer; and
forming a drain region in the drift region on a side of the trench isolation structure farther away from the first oxide layer and forming a source region on a side of the first oxide layer farther away from the drift region.

Optionally, the formation of the mask layer may include:
forming a mask material layer on the substrate;
forming a first photoresist layer, in which a first opening is formed, on the mask material layer using a photomask; and
forming the first window in the mask material layer by etching the mask material layer with an aid of the first photoresist layer, thereby forming the mask layer.

Optionally, widening the first window into the second window may include:
forming a second photoresist layer on the mask material layer by performing a patterning process using a photomask, the second photoresist layer having a second opening formed therein, the second opening exposing at least a portion of the mask layer immediately adjacent to the trench isolation structure; and
removing the portion of the mask layer exposed in the second opening so that a portion of the substrate is exposed at least on one side of the trench isolation structure.

Optionally, the photomask used in the formation of the first photoresist layer may be the same as that used in the formation of the second photoresist layer, wherein during the formation of the second photoresist layer using the photomask that has been used in the formation of the first photoresist layer, exposure parameters and/or development parameters of the patterning process are adjusted so that a width of the second opening in the second photoresist layer is greater than a width of the first opening in the first photoresist layer.

The proposed diffused FET is dually optimized in voltage resistance both by the trench isolation structure formed in the drift region and by the thick second oxide layer provided by the thick second oxide layer formed on the drift region in the substrate and thus has a more significantly improved breakdown voltage. According to the invention, with the thick second oxide layer, suitable voltage resistance of the device can be ensured even when the trench isolation structure has a reduced size, which can result in reductions in both the overall size and on-resistance of the transistor device, or when the drift region has a higher ion dopant concentration, which can also result in an effective reduction in the device's on-resistance. Thus, the proposed diffused FET has improved voltage resistance while achieving a sensible tradeoff between voltage resistance and turn-on performance, solving the problem of conventional diffused FETs that voltage resistance optimization conflicted with, and could not be achieved at the same time as, turn-on performance optimization.

LIST OF REFERENCE NUMERALS IN THE DRAWINGS

100 Substrate
110 Pad Oxide Layer
200 Mask Layer
200a First Window
200b Second Window
310 First Photoresist Layer
310a First Opening
320 Second Photoresist Layer
320a Second Opening
330 Third Photoresist Layer
340 Fourth Photoresist Layer
400 Trench Isolation Structure
510 First Oxide Layer
520 Second Oxide Layer
530 Third Oxide Layer
600 Drift Region
700 Well Region
800 Electrode Conductive Layer
900S Source Region
900D Drain Region

DETAILED DESCRIPTION OF EXEMPLARY EMBODIMENTS

Specific embodiments of the proposed diffused FET and method will be described in greater detail below with reference to the accompanying drawings. Features and advantages of the invention will be more apparent from the following detailed description. Note that the accompanying drawings are provided in a very simplified form not necessarily presented to scale, with their only intention to facilitate convenience and clarity in explaining the embodiments.

Figure 1:
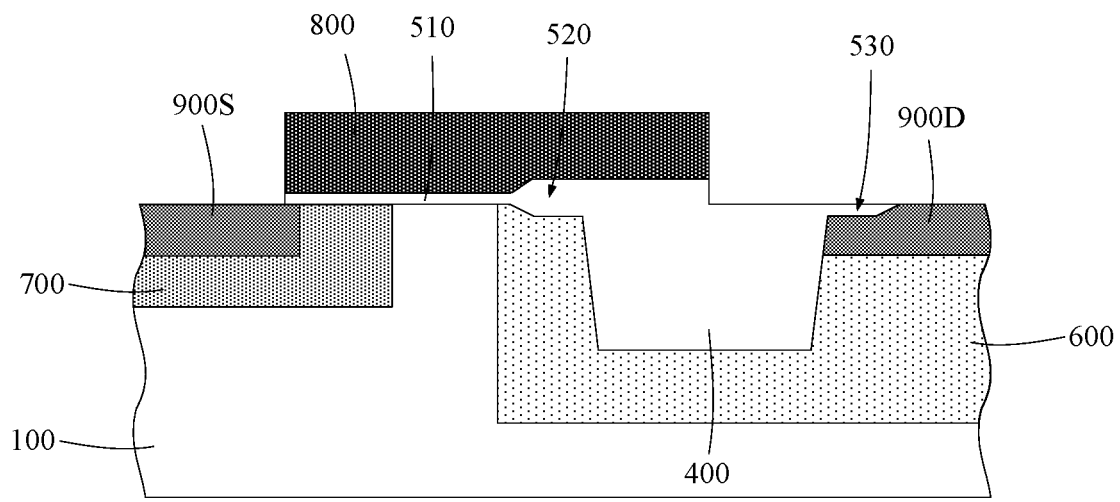
FIG. 1 is a structural schematic of a diffused field-effect transistor (FET) according to an embodiment of the present invention.

FIG. 1 schematically illustrates the structure of a diffused field-effect transistor (FET) according to an embodiment of the present invention. As shown in the figure, the diffused FET includes a substrate 100, a trench isolation structure 400 formed in the substrate 100, as well as a first oxide layer 510 and a second oxide layer 520, both formed on the substrate 100.

Specifically, a drift region 600 is formed in the substrate 100, and a drain region 900D is formed in the drift region 600. The drift region 600 may be of a conductivity type that is the same as that of the drain region 900D and opposite to that of the substrate 100. For example, the substrate 100 may be of a first conductivity type, while the drift region 600 and the drain region 900D may be both of a second conductivity type. In addition, the drain region 900D may have an ion dopant concentration higher than that of the drift region 600. According to this embodiment, the first conductivity type may be P-type, while the second conductivity type may be N-type. In alternative embodiments, the first conductivity type may be N-type, whilst the second conductivity type may be P-type.

It is to be noted that since the drift region 600 and the substrate 100 are of opposite doping types, the drift region 600 forms a high-resistance region that bears a large part of the voltage applied across the diffused FET, effectively improving the FET's breakdown voltage and reducing its source-drain parasitic capacitance.

Additionally, in the substrate 100, a source region 900S is formed on one side of the drift region 600. The source region 900S may be of the same conductivity type as the drain region 900D. According to this embodiment, the source region 900S and the drain region 900D may be both N-type components.

With continued reference to FIG. 1, the trench isolation structure 400 is formed in the drift region 600 in the substrate 100 and is located between the drain region 900D and the source region 900S. It is to be noted that the trench isolation structure 400 is able to effectively improve the diffused FET's breakdown voltage and optimize its voltage resistance.

Specifically, the trench isolation structure 400 may include an isolation trench formed in the drift region 600 in the substrate 100 and an insulating material layer optionally consisting of silicon oxide (SiO) and/or silicon nitride (SIN) or the like.

With continued reference to FIG. 1, the first oxide layer 510 is formed on the substrate 100 and extends from the source region 900S to the drift region 600. The second oxide layer 520 is formed on the drift region 600 in the substrate 100 and is located on the side of the trench isolation structure 400 closer to the source region 900S. That is, the second oxide layer 520 is formed between the portion of the trench isolation structure 400 closer to the drain region 900D and the first oxide layer 510. At least part of the first oxide layer 510 may form a gate oxide layer in a gate structure, and the second oxide layer 520 may form a field oxide layer in a field-plate structure.

It would be recognized that the length of the first oxide layer 510 above the drift region may be adjusted as practically required. For example, only a minimal length of the first oxide layer 510 may extend over the drift region 600 so that it only covers an edge of the drift region. In this case, it can be considered that the first oxide layer 510, as a whole, constitutes the gate oxide layer in the gate structure. Alternatively, when a considerable length of the first oxide layer 510 extends over the drift region 600 so that it covers a large portion of the drift region 600, it can be considered that part of the first oxide layer 510 constitutes the gate oxide layer in the gate structure while the remainder of the first oxide layer 510 constitutes, together with the second oxide layer 520, the field oxide layer. In this case, the field oxide layer consisting of part of the first and second oxide layers 510, 520 may appear as a stepped structure.

In addition, the second oxide layer 520 may have a thickness of greater than a thickness of the first oxide layer 510. It is to be noted that, according to this embodiment, the thicker second oxide layer 520 (i.e., a thickness greater than the first oxide layer 510) allows the field oxide layer to have an increase thickness, which can facilitate electric field modulation in the substrate 100 and thus improve the device's voltage resistance.

It may be configured that an average thickness of the second oxide layer 520 is greater than or equal to twice an average thickness of the first oxide layer 510. For example, the thickness of the first oxide layer 510 may lie in the range from 100 Å to 400 Å, while the thickness of the second oxide layer 520 may be greater than 1000 Å.

With continued reference to FIG. 1, the second oxide layer 520 may be connected to the insulating material layer in the trench isolation structure 400. Moreover, according to this embodiment, the second oxide layer 520 may be also connected to the first oxide layer 510. In other words, the second oxide layer 520 may be formed between the first oxide layer 510 and portion of the trench isolation structure 400, the end of the second oxide layer 520 close to the source region 900S is joined to the first oxide layer 510 and the end of the second oxide layer 520 close to the drain region 900D is connected to the trench isolation structure 400.

Optionally, an end portion of the second oxide layer 520 connected to the first oxide layer 510 may be tapered in thickness toward the first oxide layer 510. In other words, the end portion of the second oxide layer 520 connected to the first oxide layer 510 may have a beak-like shape which allows smooth transition to a variety of different possible thicknesses of the first oxide layer 510.

According to this embodiment, the second oxide layer 520 may be partially embedded in the substrate 100, a top surface of the trench isolation structure 400 may be protruding beyond a top surface of the substrate 100. This allows smooth transition from the second oxide layer 520 to the trench isolation structure 400. Further, the top surface of the trench isolation structure 400 may be not lower than a top surface of the second oxide layer 520. According to this embodiment, the top surface of the trench isolation structure 400 may be flush with the top surface of the second oxide layer 520.

With continued reference to FIG. 1, the diffused FET further includes an electrode conductive layer 800 which covers both the first and second oxide layers 510, 520. According to this embodiment, the electrode conductive layer 800 may extend over the entire second oxide layer 520 and further over the trench isolation structure 400.

In other words, the electrode conductive layer 800 covers both the gate oxide layer and the field oxide layer, wherein the portion of the electrode conductive layer 800, which covers the gate oxide layer, forms a gate conductive layer in the gate structure, and the portion of the electrode conductive layer 800, which covers the field oxide layer, forms a field-plate electrode in the field-plate structure. Therefore, it can be considered that the electrode conductive layer 800 includes a first portion serving as the gate conductive layer and a second portion serving as the field-plate electrode.

According to this embodiment, the gate oxide layer provided by the first oxide layer 510 and the gate conductive layer provided by the first portion of the electrode conductive layer 800 that covers the first oxide layer 510 together form the aforementioned gate structure, which is configured to switch on or off the transistor. Therefore, the generally small thickness of the thin first oxide layer 510 can ensure the performance of the diffused FET.

Furthermore, the field-plate electrode in the field-plate structure provided by the second portion of the electrode conductive layer 800 that covers the second oxide layer 520 is configured to modulate and homogenize an electric field distribution in the substrate, thereby helping in improving the breakdown voltage of the diffused FET. As described above, since the thickness of the second oxide layer 520 is generally greater (i.e., greater than the thickness of the first oxide layer 510), the resulting field-plate structure can more efficiently homogenize an electric field distribution in the drift region, thus improving the device's voltage resistance.

As described above, according to this embodiment, the end portion of the second oxide layer 520 connecting the first oxide layer 510 has a beak-like shape, which allows smooth transition from the second oxide layer 520 to the first oxide layer 510. With this design, the electrode conductive layer 800 can better cover the connection between the first and second oxide layers 510, 520. As a result, electric charge accumulation at the connection can be effectively mitigated, resulting in an improvement in the device's performance.

It is to be noted that the diffused FET according to the embodiment is dually optimized in voltage resistance both by the trench isolation structure 400 and the thick second oxide layer 520. It can be considered that, according to this embodiment, with the thicker second oxide layer 520, suitable voltage resistance of the transistor can be ensured even when the trench isolation structure 400 has a reduced width, which can result in reductions in both the overall size and on-resistance of the transistor. It would be also appreciated that, with the thicker second oxide layer 520, suitable voltage resistance of the transistor can be ensured even when the drift region 600 has a higher ion dopant concentration, which can also result in an effective reduction in the transistor's on-resistance. Thus, the diffused FET according to this embodiment achieves a sensible tradeoff between its voltage resistance and turn-on performance, solving the problem of conventional diffused FETs that voltage resistance optimization conflicted with, and could not be achieved at the same time as, turn-on performance optimization.

With continued reference to FIG. 1, the substrate 100 may be further formed therein with a well region 700, which is located on one side of the drift region 600, contains the source region 900S and extends toward the drift region 600 to under the first oxide layer 510. That is, the source region 900S may be formed in the well region 700. The well region 700 may be of the same conductivity type (e.g., P-type) as the substrate 100 and the well region 700 may have an ion dopant concentration higher than that of the substrate 100.

According to this embodiment, the well region 700 may partially extend under the first oxide layer 510 covered by the electrode conductive layer 800. Accordingly, the electrode conductive layer 800 may laterally extend to over the source region 900S and cover part of the well region 700.

The part of the well region 700 right under the electrode conductive layer 800 may, for example, provide a conductive channel of the diffused FET.

It is to be noted that, according to this embodiment, the well region 700 is spaced apart from the drift region 600. However, it could be appreciated that, in other embodiments, the well region 700 may alternatively be connected to the drift region 600.

Furthermore, according to this embodiment, a third oxide layer 530 may be formed on a portion of the drift region in the substrate on the side of the trench isolation structure 400 closer to the drain region 900D. According to this embodiment, the third oxide layer 530 may be partially or entirely embedded in the substrate 100 and connected to the trench isolation structure 400. Additionally, the portion of the substrate where the third oxide layer 530 is formed may be, for example, symmetrical to the portion of the substrate where the second oxide layer 520 is formed with respect to a center line of the trench isolation structure 400.

Figure 2:
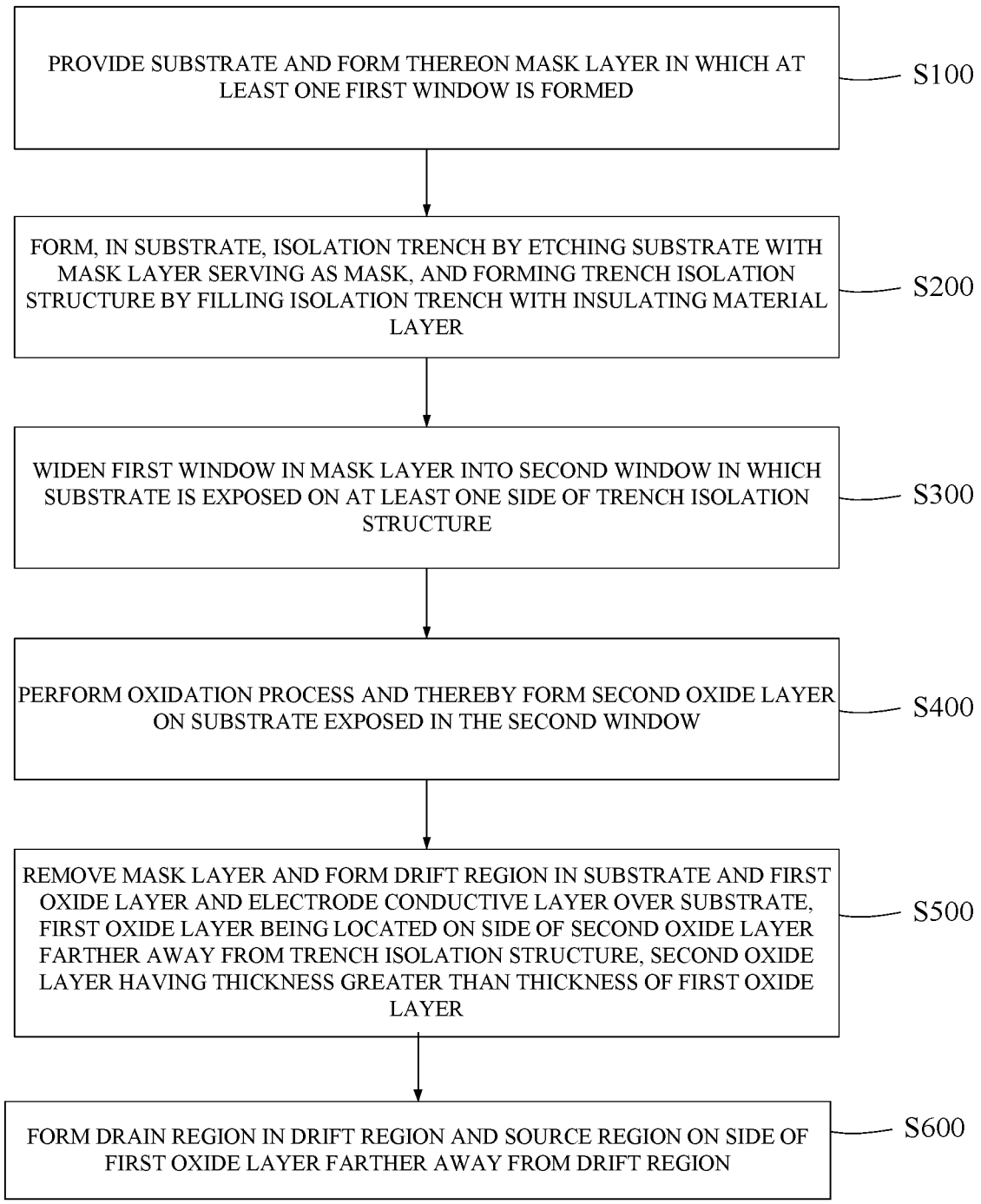
FIG. 2 is a flowchart graphically illustrating a method of fabricating a diffused FET according to an embodiment of the invention.

In conjunction with the above description, a method of fabricating a diffused FET will be described in detail below with reference to the accompanying drawings. FIG. 2 is a flowchart graphically illustrating the method according to an embodiment of the present invention. FIGS. 3a to 3j are diagrams schematically illustrating the method as well as structures resulting from steps therein according to an embodiment of the present invention.

Figure 3A:
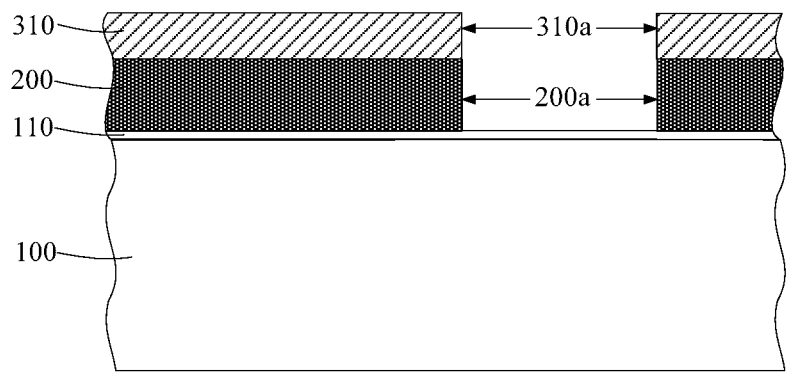
FIGS. 3a through 3j are diagrams schematically illustrating a method of fabricating a diffused FET as well as structures resulting from steps therein according to an embodiment of the present invention.

In step S100, with reference to FIG. 3a, a substrate 100 is provided, on which a mask layer 200 with at least one first window 200a therein is formed.

The formation of the mask layer 200 with the first window 200a may include the steps of:
a) forming on the substrate 100 a mask material layer including, e.g., silicon nitride and having a thickness, e.g., in the range of 500 Å to 1200 Å;
b) with reference to FIG. 3a, forming a first photoresist layer 310 on the mask material layer using a photomask for forming an isolation trench and forming, in the first photoresist layer 310, a first opening 310a for facilitating the subsequent formation of the isolation trench;
c) forming the first window 200a in the mask material layer by etching the mask material layer with the aid of the first photoresist layer 310, thus leading to the formation of the mask layer 200.

As shown in FIG. 3a, according to this embodiment, subsequent to the patterning of the mask layer 200, the first photoresist layer 310 is retained so as to serve, together with the patterned mask layer 200 as a mask for forming the isolation trench.

With continued reference to FIG. 3a, according to this embodiment, a top surface of the substrate 100 is covered by a pad oxide layer 110. That is, the pad oxide layer 110 separates the mask layer 200 from the substrate 100. The pad oxide 110 may have a thickness in the range of from 100 Å to 400 Å.

It is to be noted that directly forming the mask layer 200 on the substrate 100 may lead to significant stress on the substrate 100, particularly when the mask layer 200 is made of nitride layer. According to this embodiment, the pad oxide layer 110 disposed between the mask layer 200 and the substrate 100 can serve as a buffer layer for relieving such stress. The pad oxide layer 110 can also function to isolate the substrate 100, protecting the substrate surface against contamination during the subsequent removal of the mask layer 200.

Figure 3B:
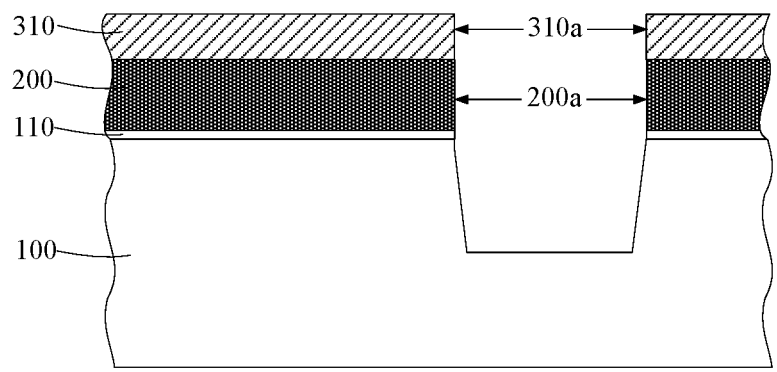
Figure 3C:
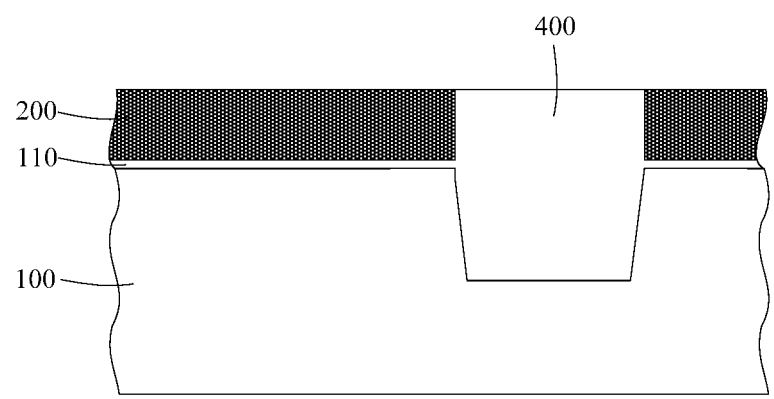

In step S200, with reference to FIGS. 3b and 3c, an isolation trench is formed in the substrate 100 by etching the substrate 100 with the mask layer 200 serving as a mask, and a trench isolation structure 400 is formed by filling the isolation trench with an insulating material layer. Suitable insulating materials may include, for example, silicon oxide.

As described above, according to this embodiment, in addition to the mask layer 200, the mask used in the formation of the isolation trench also includes the first photoresist layer 310, which is removed after the formation of the isolation trench and prior to the filling of the insulating material layer.

The isolation trench may have a depth between 2500 Å and 5000 Å and an opening size gradually decreasing from its top to the bottom. That is, the isolation trench may have inclined side walls (making the isolation trench cross-sectionally appear, e.g., as an inverted trapezoidal shape), which can facilitate the filling of the insulating material in the isolation trench by avoiding the formation of voids in the insulating material layer.

Specifically, the filling of the insulating material layer in the isolation trench may include a high-density plasma (HDP) process, in which the insulating material is deposited so that it fills up the isolation trench and covers a top surface of the mask layer 200, and a subsequent planarization process, in which the insulating material disposed above the top surface of the mask layer is removed so that the insulating material retained in the isolation trench constitutes the insulating material layer.

According to this embodiment, the planarization process may be a chemical mechanical polishing (CMP) process with the mask layer 200 as a stop layer. As a result of the process, a top surface of the insulating material layer in the trench isolation structure 400 may be flush with the top surface of the mask layer 200. In other words, the insulating material layer fills both the isolation trench and the first window in the mask layer 200 so that its top surface protrudes beyond that of the substrate 100.

Figure 3D:
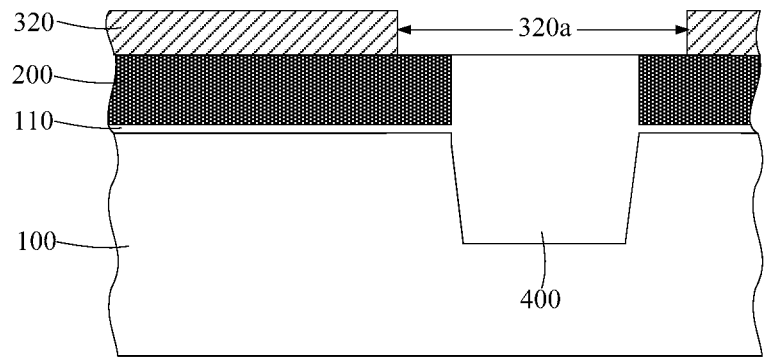
Figure 3E:
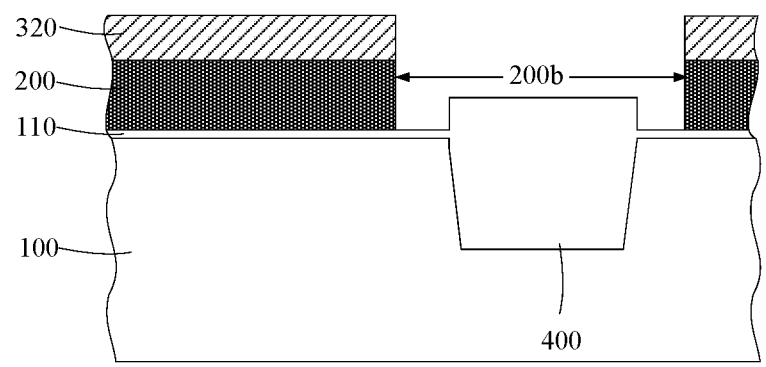

In step S300, with reference to FIGS. 3d and 3e, the first window in the mask layer 200 is widened, resulting in the formation of a second window 200b in which the substrate is exposed at least on one side of the trench isolation structure 400. A second oxide layer will be formed on the exposed portion of the substrate. According to this embodiment, exposure of the substrate 100 in the second window 200b is meant to refer to exposure of the pad oxide layer 110.

Specifically, forming the second window 200b by widening the first window in the mask layer 200 may include the following steps.

In a first step, with reference to FIG. 3d, a patterning process using a photomask is performed to form a second photoresist layer 320 with a second opening 320a therein, in which at least a portion of the mask layer 200 adjacent to the trench isolation structure 400 is exposed.

According to this embodiment, the photomask for forming the isolation trench may be directly used in the formation of the second photoresist layer 320. That is, the first and second photoresist layers 310, 320 may be formed using the same photomask. The second opening 320a in the second photoresist layer 320 is in positional correspondence with and wider than the first opening 310a in the first photoresist layer 310.

Thus, according to this embodiment, the second opening 320a is also wider than the trench isolation structure 400, the trench isolation structure 400, together with at least portions of the mask layer on opposing sides of the trench isolation structure 400, is exposed in the second opening 320a.

Specifically, in order to form the second photoresist layer 320 using the same photomask for forming the isolation trench, for example, exposure parameters of the patterning process (including an exposure time) may be adjusted to form the opening with a different size from the isolation trench. Alternatively, this may also be achieved by adjusting development parameters of the patterning process (including a development time or a concentration of the used developing agent).

Further, a total width of the mask layer exposed in the second opening 320a may range from 200 Å to 1200 Å. That is, the first opening 310a may be widened by 100 Å-600 Å at each side so as to form the second opening 320a.

In a second step, with reference to FIG. 3e, the portions of the mask layer 200 exposed in the second opening 320a is removed so that the underlying pad oxide layer 110 on the substrate 100 is exposed. As a result, the first window is widened, forming the second window 200b, in the mask layer 200.

Optionally, the exposed portions of the mask layer 200 may be removed by an etching process. In this case, the process may also remove part of the trench isolation structure 400, leading to lowering of its top surface (i.e., its thickness is reduced). Nevertheless, it should be recognized that while the lowered top surface of the trench isolation structure 400 is lower than the top surface of the mask layer 200, it is still higher than the top surface of the substrate 100.

The second photoresist layer 320 may be removed after the widening of the first window in the mask layer 200 by partial removal of the mask layer 200.

Figure 3F:
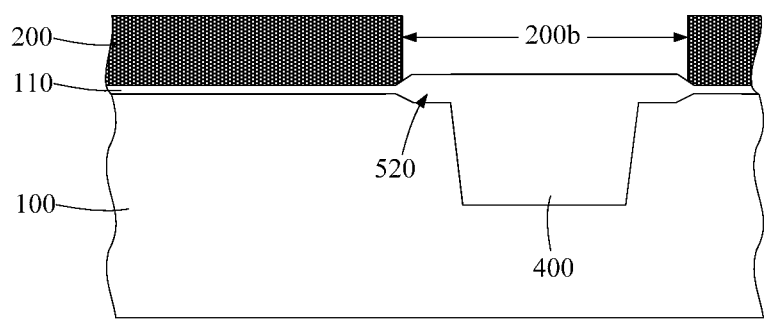

In step S400, with reference to FIG. 3f, an oxidation process is performed to form a second oxide layer 520 on the substrate 100 exposed in the second window 200b. Likewise, according to this embodiment, the second oxide layer 520 having a larger thickness is formed on the pad oxide layer 110.

It is to be noted that, according to this embodiment, the second oxide layer 520 results from an oxidation process performed over the exposed trench isolation structure 400 and the exposed portion of the substrate 100 lateral thereto. This is helpful in achieving smooth transition from the second oxide layer 520 to the trench isolation structure 400, mitigating electric charge accumulation and improving voltage resistance of the transistor device being fabricated.

According to this embodiment, during the oxidation process, in parallel with the vertical diffusion through the pad oxide layer 110 into the underlying substrate 100, oxygen also diffuses laterally so that the resulting second oxide layer 520 further has a portion extending under the mask layer 200 and assuming a beak-like shape.

The oxide layer resulting from the oxidation process may have portions located on opposing sides of the trench isolation structure 400. Specifically, with the opposing sides of the trench isolation structure 400 referred herein respectively as a first side and a second side, the portion of the oxide layer on the first side may have a width that is equal to a width of the portion on the second side. In addition, as described above, since the oxide layer also has portions extending under the mask layer 200, on each of said sides, a total length of the oxide layer (e.g., the second oxide layer 520) is not smaller than the length by which the first opening 310a is widened to form the second opening 320a.

Figure 3G:
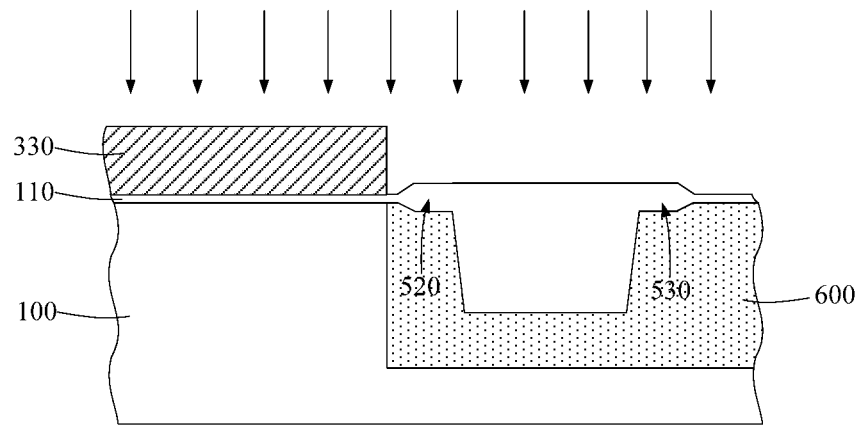
Figure 3H:
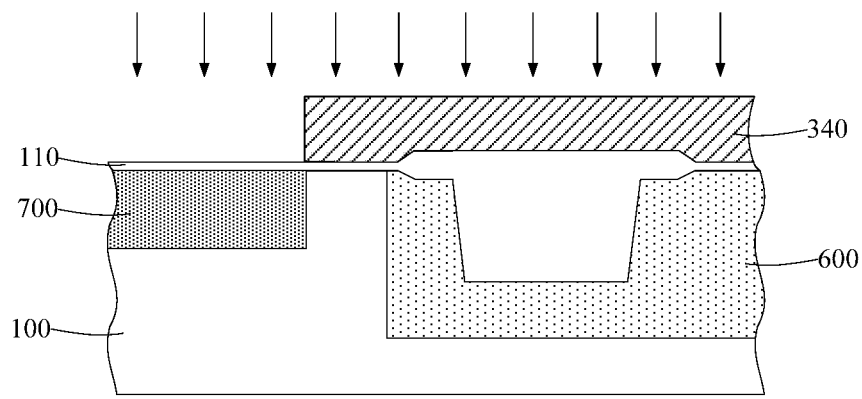
Figure 3I:
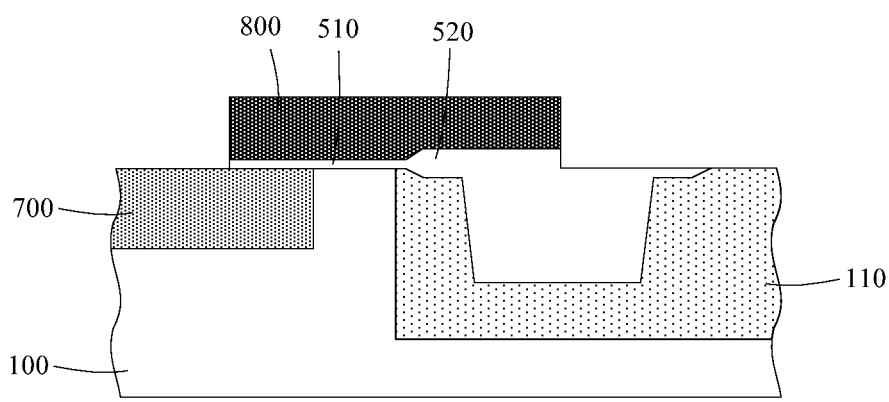

In step S500, with reference to FIGS. 3g to 3i, the mask layer is removed, followed by the formation of a drift region 600 in the substrate 100 and the formation of a first oxide layer 510 and an electrode conductive layer 800 both on the substrate 100. The drift region 600 surrounds the trench isolation structure 400 and extends beyond an outer edge of the second oxide layer 520. The first oxide layer 510 is located on the side of the second oxide layer 520 farther away from the trench isolation structure 400, and the second oxide layer 520 has a thickness greater than a thickness of the first oxide layer 510.

The drift region 600 may be formed, as better shown in FIG. 3g, by carrying out an ion implantation process using a third photoresist layer 330 which covers the structure except for a target area. According to this embodiment, for example, in order to form an N-type drift region 600, ions suitable to be implanted may include phosphorus or arsenic ions.

According to this embodiment, the portions of the oxide layer respectively on the first and second sides of the trench isolation structure 400 are equal in width, and the minimum distances from the respective oxide layer portions to respective boundaries of the drift region on the respective sides differ from each other.

Specifically, as shown in FIG. 3g, the drift region 600 extends beyond respective outer edges of the portions of the oxide layer respectively on the first and second sides of the trench isolation structure 400. Moreover, the minimum distance from the oxide layer portion on the first side to the boundary of the drift region on the same side is different from the minimum distance from the oxide layer portion on the second side to the boundary of the drift region on the same side. According to this embodiment, the oxide layer portion formed on the first side of the trench isolation structure 400 is defined as the second oxide layer 520, and that on the second side of the trench isolation structure 400 as a third oxide layer 530. The minimum distance from the second oxide layer 520 to the respective boundary of the drift region is smaller than that from the third oxide layer 530 to the respective boundary of the drift region.

According to this embodiment, the first oxide layer 510 is formed on the first side of the trench isolation structure 400 and, in a subsequent process, a drain region is formed in the drift region 600 situated on the second side of the trench isolation structure 400.

In another embodiment, with reference to FIG. 3h, the method may further include forming a well region 700 in the substrate 100 so that it is located on one side of the drift region 600. According to this embodiment, the well region 700 is formed on the first side of the trench isolation structure 400 and is spaced apart from the drift region 600.

The formation of the well region 700 may specifically include: forming a fourth photoresist layer 340 which covers the structure except for a target area; and performing an ion implantation process in the target area. According to this embodiment, for example, in order to form a P-type well region 700, ions suitable to be implanted may include boron ions.

Each of the ion implantation processes for forming the drift region 600 and the well region 700 may be followed by a thermal annealing process for repairing any damage possibly caused by ion implantation and activating the implanted ions.

It should be recognized that, while the drift region 600 has been described above as being formed prior to the formation of the well region 700 as an example in accordance with this embodiment, in other embodiments, it is also possible to form the well region 700 prior to the formation of the drift region 600. Moreover, it is to be noted that, according to this embodiment, during the ion implantation processes for forming the drift region 600 and the well region 700, the pad oxide layer 110 on the substrate 100 can serve to protect the top surface of the substrate 100 against any possible damage.

With particular reference to FIG. 3i, the first oxide layer 510 and the electrode conductive layer 800 are stacked on the substrate 100. The first oxide layer 510 may be formed by an oxidation process optionally subsequent to the removal of the pad oxide layer 110.

Further, the formation of the electrode conductive layer 800 may include, for example, forming and etching an electrode material layer. According to this embodiment, the electrode conductive layer 800 covers part of the trench isolation structure 400 and the second oxide layer 520 and further extends over part of the well region 700.

Figure 3J:
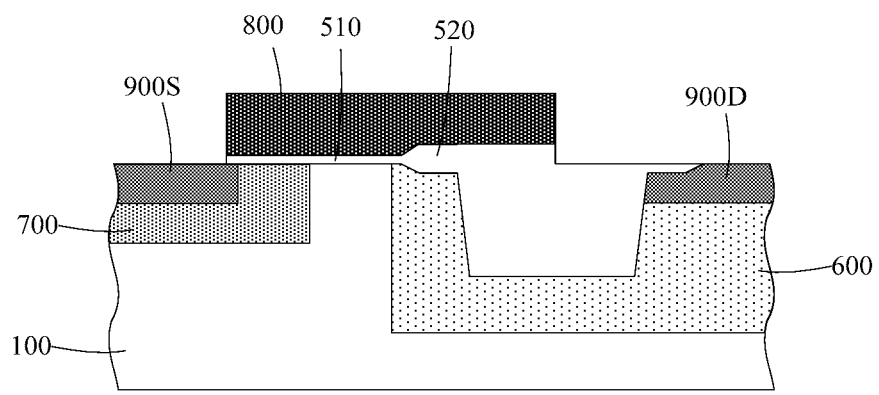

In step S600, with reference to FIG. 3j, a drain region 900D is formed in the drift region 600 and the drain region 900D is formed on the side of the trench isolation structure 400 farther away from the first oxide layer 510, and a source region 900S is formed on the side of the first oxide layer 510 farther away from the drift region 600.

According to this embodiment, the source region 900S is formed in the well region 700. Moreover, according to this embodiment, for example, an ion implantation process may be performed to form an N-type source region 900S and an N-type drain region 900D, and ions suitable to be implanted may include arsenic and/or phosphorus ions In summary, the diffused FET according to this embodiment is dually optimized in voltage resistance both by the trench isolation structure formed in the drift region and the thick field oxide layer provided by the thick second oxide layer. It is to be noted that, when the first oxide layer further extends over the drift region and is connected to the second oxide layer, the field oxide layer can be considered as a stepped structure consisting of part of the first oxide layer and the second oxide layer. In this case, even better electric field modulation can be achieved, resulting in a weaker surface electric field and a higher breakdown voltage of the device.

Since the diffused FET incorporates the thick second oxide layer, the trench isolation structure is allowed to have a reduced size while not compromising the voltage resistance of the device, which is not only helpful in overall miniaturization of the device, but can result in a reduction in its on-resistance. Alternatively, with the voltage resistance of the device being maintained, the drift region is allowed to have a higher ion dopant concentration, which can also result in a reduction in the device's on-resistance. Thus, the diffused FET can achieve a good tradeoff between voltage resistance and on-resistance.

It is noted that while the invention has been described with reference to several preferred embodiments, it is not intended to be limited to these embodiments in any way. In light of the above teachings, any person of skill in the art may make various possible variations and changes to the subject matter of the present invention or modify it to equivalent alternatives without departing from the scope of the invention. Accordingly, any and all such simple variations, equivalent alternatives and modifications made without departing from the scope of the invention are intended to fall within this scope.

It is also noted that the terms "first", "second", "third" and the like as used herein are only intended to distinguish between various components, elements, steps, etc. rather than implying any logical or ordinal relationship among them, unless otherwise specified or indicated.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

What is claimed is:

1. A diffused field-effect transistor (FET), comprising:
    a substrate, in which a drift region is formed, the drift region containing a drain region, wherein a source region is formed in the substrate and is located on one side of the drift region;
    a trench isolation structure, formed in the drift region and located between the drain region and the source region;
    a first oxide layer, formed on the substrate and extending from the source region to the drift region;
    a second oxide layer, formed on the drift region and located on a side of the trench isolation structure closer to the source region, the second oxide layer having a thickness greater than a thickness of the first oxide layer;
    an electrode conductive layer, formed at least on the first and second oxide layers; and
    a third oxide layer, formed on a portion of the drift region in the substrate on a side of the trench isolation structure closer to the drain region, wherein the third oxide layer is partially or entirely embedded in the substrate and connected to the trench isolation structure, a portion of the substrate where the third oxide layer is formed symmetrical to a portion of the substrate where the second oxide layer is formed with respect to a center line of the trench isolation structure,
    wherein at least part of the first oxide layer forms a gate oxide layer in a gate structure, and the second oxide layer forms a field oxide layer in a field-plate structure.

2. The diffused FET according to claim 1, wherein the second oxide layer is located between the first oxide layer and the trench isolation structure and connects the first oxide layer to the trench isolation structure.

3. The diffused FET according to claim 2, wherein an end portion of the second oxide layer connecting the first oxide layer has a gradually decreased thickness toward the first oxide layer.

4. The diffused FET according to claim 2, wherein the second oxide layer is partially embedded in the substrate, and wherein the trench isolation structure has a top surface protruding beyond a top surface of the substrate.

5. The diffused FET according to claim 1, wherein the second oxide layer has an average thickness greater than or equal to twice an average thickness of the first oxide layer.

6. The diffused FET according to claim 1, wherein a well region is further formed in the substrate on the one side of the drift region, and wherein the source region is formed in the well region.

7. The diffused FET according to claim 1, wherein only a minimal length of the first oxide layer extends over the drift region so that it only covers an edge of the drift region, so that the first oxide layer, as a whole, constitutes the gate oxide layer in the gate structure.

8. The diffused FET according to claim 1, wherein when a considerable length of the first oxide layer extends over the drift region so that it covers a large portion of the drift region, so that part of the first oxide layer constitutes the gate oxide layer in the gate structure while the remainder of the first oxide layer constitutes, together with the second oxide layer, the field oxide layer in the field-plate structure.

9. The diffused FET according to claim 8, wherein the field oxide layer consisting of part of the first and second oxide layers appears as a stepped structure.

10. The diffused FET according to claim 1, wherein the electrode conductive layer covers both the gate oxide layer and the field oxide layer.

\* \* \* \* \*